(12) United States Patent
Kim et al.

(10) Patent No.: US 9,269,871 B2
(45) Date of Patent: *Feb. 23, 2016

(54) LIGHT EMITTING DIODE

(71) Applicant: Seoul Viosys Co., Ltd., Ansan-si (KR)

(72) Inventors: Ye Seul Kim, Ansan-si (KR); Da Yeon Jeong, Ansan-si (KR); Kyoung Wan Kim, Ansan-si (KR); Yeo Jin Yoon, Ansan-si (KR); Sang Hyun Oh, Ansan-si (KR)

(73) Assignee: SEOUL VIOSYS CO., LTD., Ansan-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/701,374

(22) Filed: Apr. 30, 2015

(65) Prior Publication Data

US 2015/0236216 A1    Aug. 20, 2015

Related U.S. Application Data

(63) Continuation of application No. 13/818,267, filed as application No. PCT/KR2011/002361 on Apr. 5, 2011, now Pat. No. 9,024,345.

(30) Foreign Application Priority Data

Aug. 23, 2010   (KR) .......................... 10-2010-0081496

(51) Int. Cl.
*H01L 33/00*  (2010.01)
*H01L 21/00*  (2006.01)
*H01L 33/46*  (2010.01)

(Continued)

(52) U.S. Cl.
CPC .............. *H01L 33/46* (2013.01); *H01L 33/405* (2013.01); *H01L 33/42* (2013.01)

(58) Field of Classification Search
CPC ....................................................... H01L 33/46
USPC ........................... 438/26–31, 69; 257/13, 96, 257/E33.001–E33.054
See application file for complete search history.

(56) References Cited

U.S. PATENT DOCUMENTS 6,495,862 B1    12/2002   Okazaki et al.
6,650,018 B1    11/2003   Zhao et al.
7,102,175 B2    9/2006    Orita (Continued)

FOREIGN PATENT DOCUMENTS

CN    101213678    7/2008
CN    101399307    4/2009

(Continued)

OTHER PUBLICATIONS

Chinese Office Action issued Dec. 26, 2014 in Chinese Application No. 201180041118.3.

(Continued)

*Primary Examiner* — Calvin Lee
(74) *Attorney, Agent, or Firm* — Perkins Coie LLP

(57) ABSTRACT

Disclosed is a light emitting diode (LED) comprising a light emitting stacked structure and an electrode structure formed to have a pattern on the light emitting stacked structure. The electrode structure of the LED includes a cluster of reflectors disposed along the pattern on the light emitting stacked structure, and a pad material layer formed to entirely cover the reflectors.

24 Claims, 2 Drawing Sheets

(51) Int. Cl.
*H01L 33/40* (2010.01)
*H01L 33/42* (2010.01)

(56) References Cited

U.S. PATENT DOCUMENTS

| | | | |
|---|---|---|---|
| 7,244,957 B2 | 7/2007 | Nakajo et al. | |
| 7,759,690 B2* | 7/2010 | Miki et al. | 257/97 |
| 8,148,736 B2* | 4/2012 | Yahata et al. | 257/81 |
| 8,664,686 B2* | 3/2014 | Shieh et al. | 257/99 |
| 9,024,345 B2* | 5/2015 | Kim et al. | 257/98 |
| 2004/0012013 A1 | 1/2004 | Katayama | |
| 2008/0099776 A1 | 5/2008 | Lee et al. | |
| 2009/0039374 A1 | 2/2009 | Yahata et al. | |
| 2009/0078951 A1 | 3/2009 | Miki et al. | |
| 2010/0059765 A1 | 3/2010 | Lester et al. | |

FOREIGN PATENT DOCUMENTS

| | | |
|---|---|---|
| JP | 2009043934 | 2/2009 |
| KR | 1020040008092 | 1/2004 |
| KR | 1020080015922 | 2/2008 |
| KR | 100809227 | 3/2008 |
| KR | 1020100030585 | 3/2010 |

OTHER PUBLICATIONS

International Search Report dated Dec. 27, 2011 issued for PCT/KR2011/002361.

* cited by examiner

LIGHT EMITTING DIODE

CROSS-REFERENCE TO RELATED APPLICATIONS

This application is a continuation of, and claims the benefits and priorities to, U.S. patent application Ser. No. 13/818,267, filed on Feb. 21, 2013, and issued as U.S. Pat. No. 9,024,345 on May 5, 2015, which is the National Stage Entry of International Application No. PCT/KR2011/002361, filed on Apr. 5, 2011, and claims priority from and the benefits of Korean Patent Application No. 10-2010-0081496, filed on Aug. 23, 2010, which are hereby incorporated by reference for all purposes as if fully set forth herein.

BACKGROUND

1. Field

The present invention relates to a light emitting diode (LED), and more particularly, to an LED capable of improving light extraction efficiency by reducing light loss due to an electrode structure formed at an upper portion of the LED.

2. Discussion of the Background

GaN-based light emitting diodes (LEDs) are currently used in a variety of applications such as full-color LED display devices, LED traffic lights and white LEDs. Recently, it has been expected that high-efficiency white LEDs will substitute for fluorescent lamps. Particularly, the efficiency of the whit LEDs has reached the level similar to that of typical fluorescent lamps.

A GaN-based LED is generally formed by growing epitaxial layers on a substrate such as sapphire, and comprises an N-type semiconductor layer, a P-type semiconductor layer and an active layer interposed therebetween. Meanwhile, an N-electrode pad is formed on the N-type semiconductor layer, while a P-electrode pad is formed on the P-type semiconductor layer. The LED is driven by being electrically connected to an external power source through the electrode pads.

The GaN-based semiconductor layers are generally grown on a single crystalline substrate such as sapphire, and a single LED is finally completed through a chip separation process. At this time, since the single crystalline substrate is separated along its crystal plane, it typically has a rectangular shape. Generally, the shape of the substrate in a final LED defines the shape of a light emitting structure, e.g., the shape of a mesa, the shape of an electrode pad and the shape of extension portions extending from the electrode pad. For example, extension portions extending from electrode contact portions so as to enhance current spreading has been disclosed in U.S. Pat. No. 6,650,018, and these extension portions typically extend in a straight line along a rectangular edge of the rectangular shape.

By using an extension portion(s) extending from an electrode pad, it is possible to improve the effect of current spreading into an LED, thereby enhancing the efficiency of the LED. However, since a material, e.g., Cr, having a poor reflecting property is used as a lower structure of the electrode pad and the extension portion extending therefrom, there is a large amount of light loss due to light absorption at lower portions of the electrode pad and/or the extension portion. The light loss serves as a primary factor for obstructing the enhancement of the light extraction efficiency of the LED. Although a number of studies have been conducted to reduce the light loss by decreasing the entire area of an electrode pattern having an extension portion, the decrease of the entire area of the electrode pattern may have a bad influence on the current spreading effect of an LED. Particularly, it may be difficult to implement a large-area LED chip.

SUMMARY

An object of the present invention is to provide a light emitting diode (LED) capable of not only improving the current spreading characteristics but also enhancing the light extraction efficiency of the LED by minimizing light loss due to an electrode structure at an upper portion of the LED and/or its material.

According to an aspect of the present invention, there is provided a light emitting diode (LED) comprising a light emitting stacked structure and an electrode structure formed to have a pattern on the light emitting stacked structure. The electrode structure includes a cluster of reflectors disposed along the pattern on the light emitting stacked structure, and a pad material layer formed to entirely cover the reflectors.

In one embodiment, the electrode structure may comprise an extension portion and an electrode pad which comprise the pad material layer; the extension portion may extend from the electrode pad in a linear pattern; and the cluster of the reflectors may have dot-patterned reflectors formed along the linear pattern of the extension portion. Further, the cluster of the reflectors further may have a pad-type reflector formed under the electrode pad.

In one embodiment, the pad material layer may have a contact material layer that directly covers the reflectors, and a bonding material layer positioned at the uppermost portion of the pad material layer. At this time, the contact material layer may preferably comprise Cr, while the bonding material layer may preferably comprise Au. Here, it is preferable that the reflectors are formed of a material having a higher reflectance than that of the contact material layer. More preferably, the reflectors are formed of a material having a higher reflectance and a higher insulating property than those of the contact material layer. The reflectors may be formed of a distributed Bragg reflector (DBR).

In one embodiment, the light emitting stacked structure may include a p-type region in which a transparent electrode layer is exposed toward an upper portion thereof, and the electrode structure may be configured so that the reflectors adjoin a top surface of the transparent electrode layer.

In one embodiment, the light emitting stacked structure may include an n-type region in which an n-type semiconductor layer is exposed toward an upper portion thereof, and the electrode structure may be configured so that the reflectors adjoin an exposed top surface of the n-type semiconductor layer.

The light emitting stacked structure may include the p-type region in which the transparent electrode layer is exposed toward the upper portion thereof, and the n-type region in which the n-type semiconductor layer is exposed toward the upper portion thereof; and the electrode structures may be formed in the p-type and n-type regions, respectively. In the p-type region, the electrode structure may be configured so that the reflectors adjoin the top surface of the transparent electrode layer. In the n-type region, the electrode structure may be configured so that the reflectors adjoin the exposed top surface of the n-type semiconductor layer.

The light emitting stacked structure may include Group-III nitride-based semiconductor layers, and may further comprise a transparent electrode layer.

According to another aspect of the present invention, there is provided an LED comprising a light emitting stacked structure including a lower contact layer and a mesa structure positioned on the lower contact layer; a first electrode structure positioned on the lower contact layer, and a second electrode structure positioned on the mesa structure, wherein at least one of the first and second structures includes a cluster of reflectors that is formed in a lower portion thereof and arranged along a pattern.

In one embodiment, the first electrode structure may include a first electrode pad and one or more extension portions extending from the first electrode pad; the second electrode structure may include a second electrode pad and one or more extension portions extending from the second electrode pad; and the cluster of the reflectors may comprise a pad-type reflector formed under the first or second pad and dot-patterned reflectors formed under the extension portions of the first or second electrode structure.

In one embodiment, the lower contact layer may have a first edge, a second edge opposite to the first edge, a third edge that connects the first and second edges to each other, and a fourth edge opposite to the third edge; and the first electrode pad may be disposed in the vicinity of the first edge, and the second electrode pad may be disposed in the vicinity of the second edge.

Here, the term "vicinity of the first edge" means that it is closer to the first edge than the second edge, and the term "vicinity of the second edge" means that it is closer to the second edge than the first edge. The term "extending toward the first (or second) edge" means that each point of the extension portion extends to be close to the first (or second) edge.

In one embodiment, the first electrode structure may have first and second lower extension portions which extend from the first electrode pad toward the second edge and have end portions being more spaced apart from each other than the beginning portions adjoining the first electrode pad; the second electrode structure may include first, second and third upper extension portions which extend from the second electrode pad; and the first and second upper extension portions may be formed to surround the first and second lower extension portions, respectively, and the third upper extension portion may extend toward a region between the first and second lower extension portions.

In one embodiment, the lower contact layer may be an n-type semiconductor, and the uppermost layer of the mesa structure may be a transparent electrode layer formed on a p-type semiconductor layer; the reflectors in the first electrode structure may be formed to adjoin an exposed upper portion of the n-type semiconductor layer, and the reflectors in the second electrode structure may be formed to adjoin an upper portion of the transparent electrode layer.

In one embodiment, the first and second electrode structures may include pad material layers which constitute first and second electrode pads and extension portions extending from the first and second electrode pads, respectively, and each of the pad material layers may have a material at a portion that adjoins the reflectors, which has a lower reflectance than those of the reflectors.

According to the present invention, an electrode structure of a light emitting diode (LED) having a cluster of reflectors may allow light loss to be reduced due to the light absorption of an electrode pad and an extension portion of the electrode pad at an upper portion of the LED, thereby considerably contributing to the improvement of light extraction efficiency. Particularly, the present invention is very effective when a material such as Cr having a lower light absorption rate is inserted under the electrode pad or the extension portion of the electrode pad. Further, an insulation material, particularly, an insulating distributed Bragg reflector (DBR), is used as the reflectors according to the present invention, so that it is possible to prevent the current crowding effect and to uniformly spread the current throughout the entire area of the LED.

DETAILED DESCRIPTION OF THE ILLUSTRATED EMBODIMENTS

Figure 1:
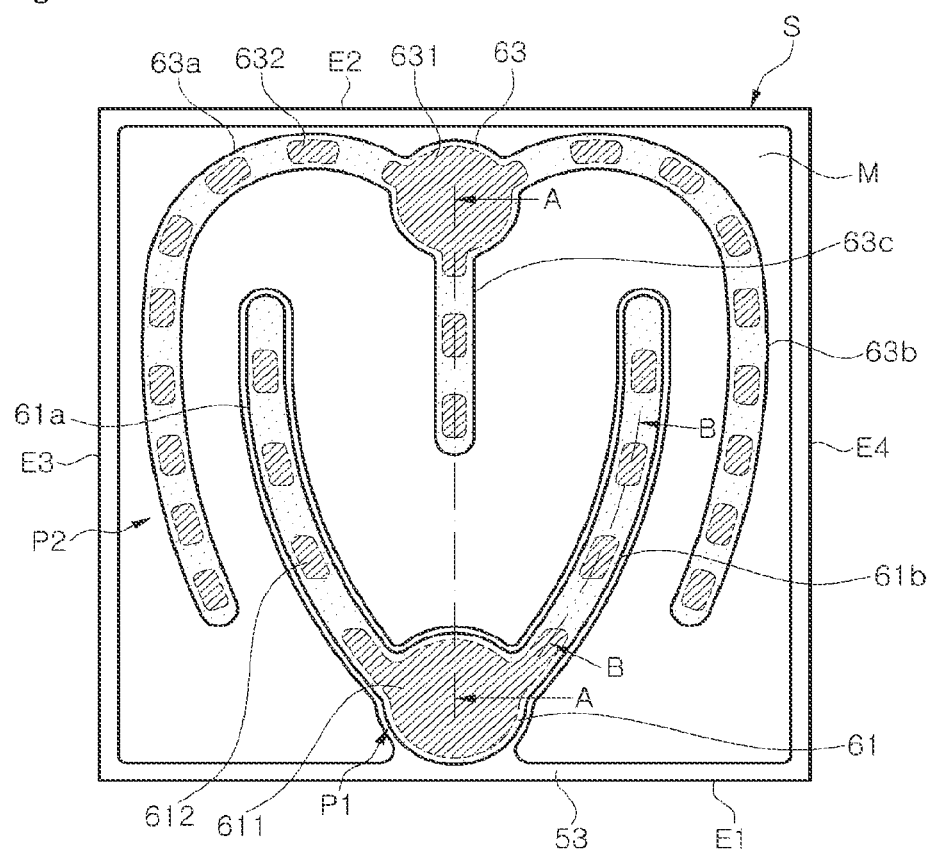
FIG. 1 is a plan view illustrating a light emitting diode (LED) according to an embodiment of the present invention.

Hereinafter, preferred embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements are exaggerated for convenience of illustration. Like reference numerals indicate like elements throughout the specification and drawings.

Figure 2:
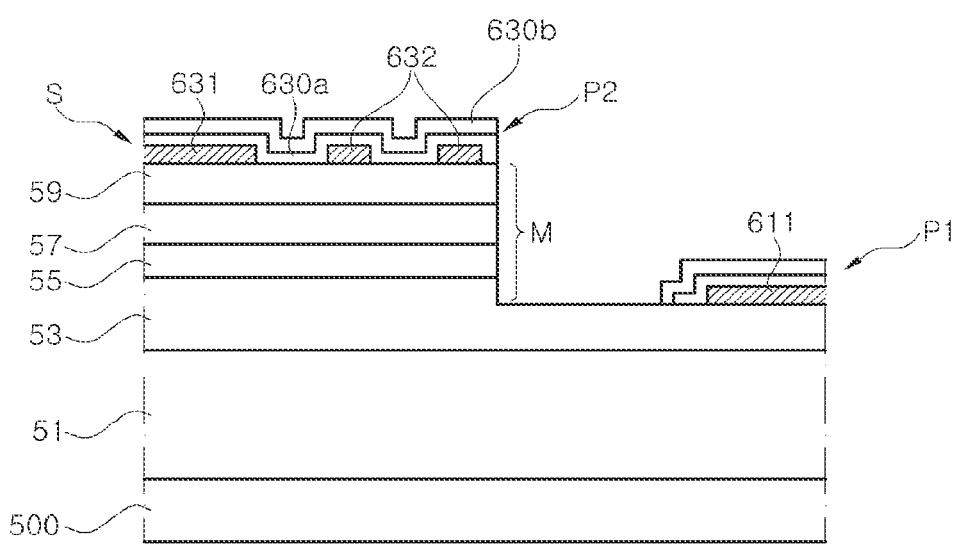
FIG. 2 is a sectional view taken along line A-A of FIG. 1.
Figure 3:
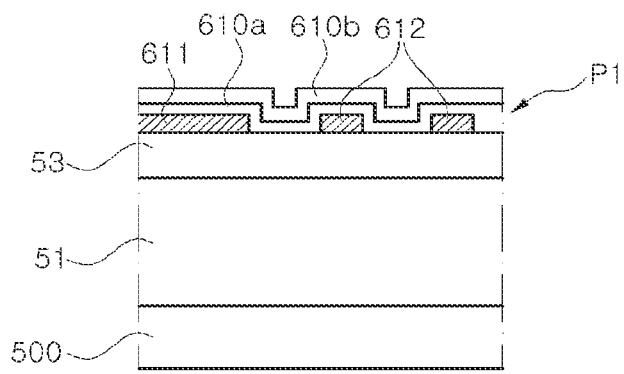
FIG. 3 is a sectional view taken along line B-B of FIG. 1.

FIG. 1 is a plan view illustrating a light emitting diode (LED) according to an embodiment of the present invention, FIG. 2 is a sectional view taken along line A-A of FIG. 1, and FIG. 3 is a sectional view taken along line B-B of FIG. 1.

Referring to FIG. 1, the LED according to the embodiment of the present invention comprises a light emitting stacked structure S and first and second electrode structures P1 and P2 formed on an upper portion of the light emitting stacked structure S.

In this embodiment, the light emitting stacked structure S comprises a lower contact layer 53 and a mesa structure M positioned on a partial region of the lower contact layer 53. The first electrode structure P1 is formed on a portion of the lower contact layer 53 on which there is no mesa structure M, and the second electrode structure P2 is formed on the mesa structure M. In this embodiment, the lower contact layer 53 is an n-type semiconductor layer, and its upper exposed region defines an n-type region. In this embodiment, the mesa structure M comprises an active layer positioned on the lower contact layer 53, a p-type semiconductor layer as an upper contact layer, and a transparent electrode layer. In this embodiment, the transparent electrode layer exists at the upper portion of the light emitting stacked structure S. The transparent electrode layer constitutes the uppermost layer of the mesa structure M. However, a case may be considered in which the upper contact layer made of a semiconductor without the transparent electrode layer constitutes the uppermost layer of the mesa structure.

According to this embodiment, the first and second electrode structures P1 and P2 may comprise clusters of reflectors 611 and 612; and 631 and 632 at the upper portion of the light emitting stacked structure S, respectively. One cluster of the reflectors 611 and 612 are arranged according to the pattern of the first electrode structure P1, and another cluster of the reflectors 631 and 632 is arranged according to the pattern of the second electrode structure P2.

The reflectors of the first and second electrode structures P1 and P2 comprise pad-type reflectors 611 and 631 formed under first and second electrode pads 61 and 63, and a plurality of dot-patterned reflectors 612 and 632 arranged in dot patterns under extension portions 61a and 61b; and 63a. 63b and 63c extending from the first and second electrode pads 61 and 63 in predetermined linear patterns, respectively. The reflectors 611, 612, 631 and 632 are arranged under the first and second electrode pads 61 and 63 and the extension portion 61a and 61b; and 63a, 63b and 63c respectively connected to the first and second electrode pads 61 and 63 along their patterns. Light is reflected from lower portions of the first and second electrode pads 61 and 63 and the extension portions 61a and 61b; and 63a, 63b and 63c, which have a relatively low reflecting property, so that light loss can be considerably reduced. Since the first and second electrode pads 61 and 63 and the extension portions 61a and 61b; and 63a, 63b and 63 are integrally connected to each other to cover the reflectors 611 and 612; and 631 and 632, respectively, the current may flow properly even though the reflectors 611 and 612; and 631 and 632 have a higher insulating property or a lower conducting property. On the contrary, if the reflectors 611 and 612; and 631 and 632 have a larger insulating property, the current spreading effect may be resultantly enhanced.

Each of the light emitting stacked structure S and the mesa structure M included therein is shaped to be an approximately rectangular or square corresponding to the shape of a substrate, and comprises a first edge E1, a second edge E2 opposite to the first edge, a third edge E3 that connects the first and second edges to each other, and a fourth edge E4 opposite to the third edge.

The first electrode structure P1 comprises an n-type first electrode pad 61, and the first electrode pad 61 is positioned on an n-type exposed region, i.e., the lower contact layer 53. The first electrode pad 61 is disposed in the vicinity of the center of the first edge E1 of the lower contact layer 53, and formed in an indentation portion of the mesa structure M. The first electrode pad 61 is a portion to which a wire may be bonded so as to connect the LED to an external power source. First and second lower extension portions 61a and 61b extend from the first electrode pad 61 toward the second edge E2. As shown in this figure, the first and second lower extension portions 61a and 61b may extend to have a symmetric structure to each other. The lower extension portions 61a and 61b directly extend from the first electrode pad 61 toward the second edge E2, so that separate extension portions for connecting the lower extension portions 61a and 61b to the first electrode pad 61 are omitted. Meanwhile, the first and second lower extension portions 61a and 61b have end portions being more spaced apart from each other than the beginning portions adjoining the first electrode pad 61. The lower extension portions 61a and 61b may be shaped as straight lines, but it is preferable that they are shaped to be convexly bent toward the third and fourth edges E3 and E4, respectively. That is, the first lower extension portion 61a is shaped to be convexly bent toward the third edge E3, while the second lower extension portion 61b is shaped to be convexly bent toward the fourth edge E4. The first and second lower extension portions 61a and 61b may be shaped to be wholly bent, but some portions, e.g., the end portions thereof may be shaped to be straight lines. The beginning portions of the first and second lower extension portions 61a and 61b may be more spaced apart from the first edge E1 than the center of the first electrode pad 61.

Meanwhile, the second electrode pad 63 is positioned above the mesa structure M, and is disposed in the vicinity of the center of the second edge E2 of the lower contact layer 53. The second electrode pad 63 may be formed on the transparent electrode layer that constitutes the uppermost layer of the mesa structure M. Alternatively, the second electrode pad may penetrate the transparent electrode layer to come in contact with the upper contact layer, e.g., the p-type semiconductor layer, positioned under the transparent electrode layer.

A first upper extension portion 63a, a second upper extension portion 63b and a third upper extension portion 63c extend from the second electrode pad 63. The first and second extension portions 63a and 63b may extend to have a symmetric structure with respect to a straight line obtained by connecting the first and second electrode pads 61 and 63 to each other. The first and second upper extension portions 63a and 63b extend from the second electrode pad 63 so as to surround the first and second lower extension portions 61a and 61b. That is, the first and second upper extension portions 63a and 63b are positioned to be closer to the third and fourth edges E3 and E4 than the first and second lower extension portions 61a and 61b, respectively.

Further, the first and second upper extension portions 63a and 63b may be shaped to be convexly bent toward the third and fourth edges E3 and E4, respectively. Each of the first and second upper extension portions 63a and 63b may firstly extend from the second electrode pad 63 toward the second edge E2 and then toward the first edge E1. Thus, it is possible to control the distances which run from the end portions of the first and second lower extension portions 61a and 61b to the first and second upper extension portions 63a and 63b, respectively.

The end portions of the first and second upper extension portions 63a and 63b may be closer to the first edge E1 than the beginning portions of the first and second lower extension portions 61a and 61b, respectively. For example, the end portions of the first and second upper extension portions 63a and 63b may be positioned on a straight line that passes through the center of the first electrode pad 61 so as to be parallel to the first edge E1. That is, the shortest distance from the first edge E1 to the center of the first electrode pad 61 may be identical to those from the first edge E1 to the end portions of the first and second upper extension portions 63a and 63b. Alternatively, the shortest distances from the first edge E1 to the end portions of the first and second upper extension portions 63a and 63b may be shorter than that from the first edge E1 to the center of the first electrode pad 61.

Meanwhile, the first and second upper extension portions 63a and 63b may firstly extend to be close to the third and fourth edges E3 and E4 and then to be distant from the third and fourth edges E3 and E4, respectively. The configuration of the extension portions as described above may allow the distances between the first and second upper extension portions 63a and 63b and the first and second lower extension portions 61a and 61b to be approximately constant, and thus it is possible to achieve a uniform current spreading throughout most regions of the mesa structure M. Further, the beginning portions of the first and second upper extension portions 63a and 63b may be closer to the second edge E2 than the center of the second electrode pad 63. As a result, it is possible to prevent the distances between the second edge E2 and the first and second upper extension portions 63a and 63b from being more distant.

The second electrode pad 63 is positioned above the mesa structure M and in the vicinity of the second edge E2. To uniformly spread the current throughout a wider region, the second electrode pad 63 is preferably positioned to be as close as possible to the second edge E2. Further, the shortest distances between the second edge E2 and the first and second upper extension portions 63 and 63b may be identical to that between the second electrode pad 63 and the second edge E2. Accordingly, the first and second upper extension portions 63a and 63b can be disposed to be generally positioned to be close to the second edge E2 in the vicinity of the second edge E2.

Meanwhile, the third upper extension portion 63c extends toward a region between the first and second lower extension portion 61a and 61b. The third upper extension portion 63c extends toward the first electrode pad 61 in a straight line and passes through the center of the mesa structure M.

Generally, the current may be easily concentrated on a straight line between the electrode pads 61 and 63. Thus, the shortest distance from each point of the first lower extension portion 61a to the first upper extension portion 63a is preferably closer than that from the each point of the first lower extension portion 61a to the third upper extension portion 63c. Accordingly, it is possible to spread the current throughout a wider region of the mesa structure.

The shortest distance from the end portion of the first lower extension portion 61a to the first upper extension portion 63a may be closer than that from another point of the first lower extension portion 61a to the first upper extension portion 63a. That is, the distance between the first lower extension portion 61a and the first upper extension portion 63a is closest at the end portion of the first lower extension portion 61a. Further, the shortest distance from an end portion of the third upper extension portion 63c to the first lower extension portion 61a is preferably closer than the distance from the end portion of the third upper extension portion 63c to the first electrode pad 61.

Referring to FIGS. 2 and 3, the light emitting stacked structure S comprises a lower contact layer 53, an active layer 55, an upper contact layer 57 and a transparent electrode layer 59, which are sequentially formed on a transparent substrate 51. The substrate 51 is preferably a sapphire substrate suitable for growing Group-III nitride semiconductor layers. A reflecting layer 500 made of, for example, a metallic material is formed on a bottom surface of the substrate 51. In this embodiment, the aforementioned mesa structure M (see FIG. 1) comprises the active layer 55, the upper contact layer 57 and the transparent electrode layer 59, and may include a portion of the lower contact layer 53 as shown in FIG. 2. In this embodiment, the lower contact layer 53 may be an n-type semiconductor layer, while the upper contact layer 57 may be a p-type semiconductor layer. However, the present invention is not limited thereto so that the conduction-types of the lower and upper contact layers 53 and 57 may be reversed. For example, the lower contact layer may be a p-type semiconductor layer, while the upper contact layer may be an n-type semiconductor layer. The active layer 55 is interposed between the lower and upper contact layers 53 and 57.

The lower contact layer 53, the active layer 55 and the upper contact layer 57 may be formed of a GaN-based compound semiconductor material, i.e., (Al, In, Ga)N. The composition elements of the active layer 55 and the composition range of the active layer 55 are determined to emit light of a desired wavelength, e.g., ultraviolet or blue light. Each of the lower and upper contact layers 53 and 57 is formed of a material having a wider bandgap than that of the active layer 55.

The lower contact layer 53 and/or the upper contact layer 57 may be formed into a single-layered structure as shown in FIG. 2, but into a multi-layered structure. The active layer 55 may have a single or multiple quantum well structure. A buffer layer (not shown) may be interposed between the substrate 51 and the lower contact layer 53.

The semiconductor layers 53, 55 and 57 may be grown using a metal organic chemical vapor deposition (MOCVD) or molecular beam epitaxy (MBE) technique, and patterned using a photolithography process so that a region of the lower contact layer 53 is exposed, thereby forming the mesa structure M. At this time, side surfaces of the mesa structure M may be formed to be inclination surfaces using a reflow process of a photoresist. The side surfaces of the mesa structure M may be inclination surfaces having a single slope, but the present invention is not limited thereto. For example, the side surfaces of the mesa structure may be bent inclination surfaces or double inclination surfaces whose slope is changed. The transparent electrode layer 59 is ohmic-contacted with the upper contact layer 57, and may be formed of indium tin oxide (ITO) or Ni/Au. Since the transparent electrode layer 59 has a lower specific resistance than that of the upper contact layer, the transparent electrode layer 59 serves to spread the current.

As well shown in FIG. 2, the second electrode structure P2 is formed on the transparent electrode layer 59 such as an ITO layer, for example. Although not shown in this figure, the second electrode structure P2 may be formed to penetrate the transparent electrode layer, or the second electrode structure P2 may be directly formed on the upper contact layer 57, i.e., the p-type semiconductor layer, with the transparent electrode layer omitted. At this time, the second electrode structure P2 comprises a pad-type reflector 631, a plurality of dot-patterned reflectors 632 and pad material layers 630a and 630b that cover the reflectors 631 and 632. Furthermore, the pad material layers comprise a contact material layer 630a formed on the transparent electrode layer 630a so as to directly cover the reflectors 631 and 632, and a bonding material layer 630b suitable for wire bonding. The pad material layers 630a and 630b constitute a second electrode pad 63 and first, second and third upper extension portions 63a, 63b and 63c, as shown in FIG. 1. The bonding material layer 630b is preferably formed of Au, while the contact material layer 630a may be formed of Cr. However, in the case of Cr, its reflectance of light is about 40%, and its transmittance of light is about 0%. Hence, since about 60% of light is absorbed in the contact material layer 630a made of Cr, the light extraction efficiency is degraded. According to this embodiment, since the clusters of the reflectors 631 and 632 formed along the entire pattern of the first electrode structure P1 considerably decrease the light exposure area of the contact material layers 630a, the light loss can be considerably reduced. The reflectors 631 and 632 may be formed of an insulating reflecting material. In this case, the reflectors 631 and 632 may serve as current shielding layers, thereby considerably restricting the current crowding effect. Accordingly, it is possible to improve the current spreading effect. Like a distributed Bragg reflector (DBR), the reflectors of the second electrode structure P2 are preferably formed of a pad material layer, particularly, a material having not only a higher reflectance but also a higher insulating property than Cr.

As well shown in FIG. 3, the first electrode structure P1 is formed on an n-type semiconductor layer 53 as the lower contact layer. Like the second electrode structure P2, the first electrode structure P1 comprises a pad-type reflector 611, a plurality of dot-patterned reflectors 612 and pad material layers 610a and 610b that cover the reflectors 611 and 612. The pad material layers comprise a contact material layer 610a formed on the lower contact layer, i.e., the n-type semiconductor layer 53, so as to directly cover the reflectors 611 and 612, and a bonding material layer 610b suitable for wire bonding. The pad material layers 610a and 610b constitute a first electrode pad 61 and first and second lower extension portions 61a and 61b, as shown in FIG. 1. Like the bonding material layer of the second electrode structure P2, the bonding material layer 610b of the first electrode structure P1 is preferably formed of Au. Like the contact material layer of the second electrode structure P2, the contact material layer 610a of the first electrode structure P1 may be formed of Cr. Like a DBR, the reflectors of the first electrode structure P1 are preferably formed of a pad material layer, particularly, a material having not only a higher reflectance but also a higher insulating property than Cr.

Figure 4:
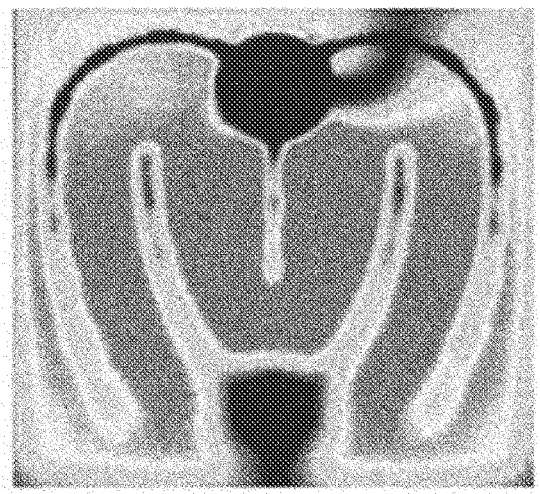
FIG. 4 is a photograph showing a state that the LED performs a light emitting operation according to the embodiment of the present invention.
Figure 5:
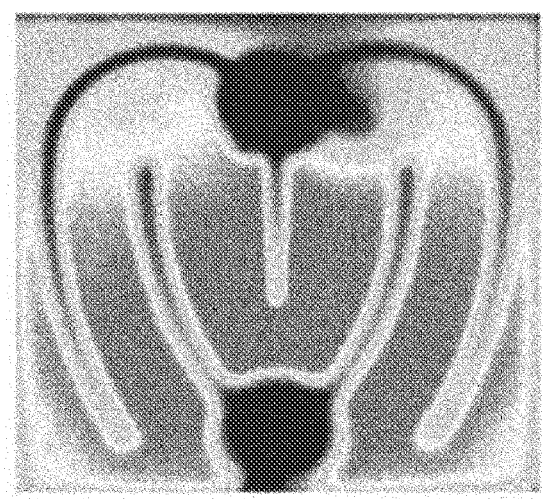
FIG. 5 is a photograph showing a state that an LED provided as a comparative example of the LED shown in FIG. 4 performs a light emitting operation.

FIG. 4 is a photograph showing a state that the LED performs a light emitting operation according to the embodiment of the present invention, and FIG. 5 is a photograph showing a state that a conventional LED according to a comparative example that does not comprise clusters of reflectors, particularly, clusters of dot-patterned reflectors, performs the light emitting operation. The LED of this embodiment and the LED of the comparative example all comprise reflecting metals on bottom surfaces of sapphire substrates, respectively. Dark regions in FIGS. 4 and 5 correspond to regions in which the intensity of light is actually large. i.e., regions which are relatively brighter than other regions.

In the LED of this embodiment shown in FIG. 4, the dot-patterned reflectors are formed under the extension portion of the electrode pad, while the pad-type reflector is formed under the electrode pad. As can be seen in FIG. 4, it may be appreciated that the number of relatively bright regions in the LED of this embodiment is larger than that of relatively bright regions in the LED of the comparative example.

As described above, the LED has been mostly illustrated in which the mesa structure allows p-type and n-type regions to be included on the light emitting stacked structure so that all the first and second electrode structures may be provided on the light emitting stacked structure. However, it should be noted that a vertical LED having only one electrode structure on the light emitting stacked structure is also within the scope of the present invention.

Although the present invention has been described in connection with the preferred embodiments, it will be understood by those skilled in the art that various modifications and changes can be made thereto without departing from the spirit and scope of the present invention defined by the appended claims.

As described above, the LED has been mostly illustrated in which the mesa structure allows p-type and n-type regions to be included on the light emitting stacked structure so that all the first and second electrode structures may be provided on the light emitting stacked structure. However, it should be noted that a vertical LED having only one electrode structure on the light emitting stacked structure is also within the scope of the present invention.

The invention claimed is:

1. A light emitting diode (LED), comprising:
a light emitting stacked structure comprising a first contact layer and a mesa structure positioned over at least a portion of the first contact layer;
a first electrode structure positioned over the first contact layer and including a first electrode pad and an extension portion extending from the first electrode pad; and
a second electrode structure positioned over the mesa structure,
wherein the first electrode structure comprises a pad type current shielding layer formed under the first electrode pad and a dot-pattern current shielding layer formed under the extension portion of the first electrode structure, and the extension portion includes another portion that is in contact with the first contact layer.

2. The LED of claim 1, wherein the extension portion extending from the electrode pad forms a linear pattern.

3. The LED of claim 1, wherein another portion of the extension portion includes an end part of the extension portion.

4. The LED of claim 1, wherein at least one of the pad type current shielding layer formed under the first electrode pad and the dot-pattern current shielding layer formed under the extension portion of the first electrode structure functions as a reflector to reflect light.

5. The LED of claim 1, wherein the first electrode structure further comprises:
a contact material layer covering the pad type current shielding layer formed under the first electrode pad and the dot-pattern current shielding layer formed under the extension portion of the first electrode structure; and
a material having a higher reflectance and a higher insulating property than that of the contact material layer.

6. The LED of claim 1, wherein the pad type current shielding layer formed under the first electrode pad and the dot-pattern current shielding layer formed under the extension portion of the first electrode structure comprise a distributed Bragg reflector (DBR).

7. The LED of claim 1, wherein the light emitting stacked structure comprises a p-type region and a transparent electrode layer formed over the p-type region, and wherein the second electrode structure has a portion contacting the transparent electrode layer.

8. The LED of claim 1, wherein the light emitting stacked structure comprises Group-III nitride-based semiconductor layers.

9. The LED of claim 1, wherein the light emitting stacked structure has an approximately rectangular or square shape including a first edge, a second edge opposite to the first edge, a third edge that connects the first and second edges to each other, and a fourth edge opposite to the third edge.

10. The LED of claim 9, wherein the first electrode pad is located near the first edge, the extension portion extends from the first electrode pad toward the second edge.

11. The LED of claim 1, wherein the second electrode structure comprises a second electrode pad and an extension portion extending from the second electrode pad.

12. The LED of claim 11, wherein the extension portion extending from the second electrode pad forms a linear pattern.

13. The LED of claim 11, wherein the second electrode structure includes a pad type current shielding layer formed under the second electrode pad and a dot-pattern current shielding layer formed under a portion of the extension portion extending from the second electrode pad.

14. A light emitting diode (LED), comprising:
a light emitting stacked structure comprising a first contact layer and a mesa structure positioned over at least a portion of the first contact layer;
a first electrode structure positioned over the first contact layer; and
a second electrode structure positioned over the mesa structure,
wherein at least one of the first electrode structure and the second electrode structure comprises reflectors, the reflectors being arranged along a pattern to reflect light;
the first electrode structure comprises a first electrode pad and at least one extension portion extending from the first electrode pad;

the second electrode structure comprises a second electrode pad and at least one extension portion extending from the second electrode pad; and the reflectors comprise a pad-type reflector disposed under at least one of the first electrode pad or the second electrode pad, and dot-patterned reflectors disposed under the extension portions of at least one of the first electrode structure or the second electrode structure.

15. The LED of claim 14, wherein the first contact layer has a shape including a first edge, a second edge opposite to the first edge, a third edge connecting the first edge and the second edge, and a fourth edge opposite to the third edge; and wherein the first electrode pad is disposed closer to the first edge than the second edge, and the second electrode pad is disposed closer to the second edge than the first edge.

16. The LED of claim 15, wherein the first electrode structure comprises a first lower extension portion and a second lower extension portion that extend from the first electrode pad toward the second edge, and the first lower extension portion and the second lower extension portion having end portions being more spaced apart from each other than beginning portions adjoining the first electrode pad.

17. The LED of claim 15, wherein the second electrode structure comprises:

a first upper extension portion, a second upper extension portion, and a third upper extension portion that extend from the second electrode pad toward the first edge; and wherein the first upper extension portion and the second upper extension portion surround the first lower extension portion and the second lower extension portion, respectively, and the third upper extension portion extends toward a region between the first lower extension portion and the second lower extension portion.

18. A light emitting diode (LED), comprising:

a light emitting stacked structure comprising a first contact layer and a mesa structure positioned over at least a portion of the first contact layer;

a first electrode structure positioned over the first contact layer; and a second electrode structure positioned over the mesa structure, wherein at least one of the first electrode structure and the second electrode structure comprises reflectors, the reflectors being arranged along a pattern to reflect light;

the first contact layer comprises an n-type semiconductor layer, and the mesa structure comprises a p-type semiconductor layer and a transparent electrode layer disposed over the p-type semiconductor layer;

the reflectors in the first electrode structure contact a portion of the n-type semiconductor layer; and the reflectors in the second electrode structure contact a portion of the transparent electrode layer.

19. The LED of claim 18, wherein the first electrode structure and the second electrode structure comprise pad material layers covering the first electrode pad, the second electrode pad, and the extension portions, and wherein the pad material layers comprise a material connecting the reflectors and having a lower reflectance than that of the reflectors.

20. A light emitting diode (LED), comprising:

a light emitting stacked structure including a first region and a second region separated from the first region, the light emitting stacked structure having a shape including a first side, second side opposite to the first side, third side, and fourth side opposite to the third side;

a first electrode structure formed over the first region and including a first electrode pad disposed near the first side of the light emitting stacked structure and an extension portion extending from the first electrode pad toward the second side of the light emitting stacked structure that is opposite to the first side; and a second electrode structure formed over the second region and including a second electrode pad disposed near the second side of the light emitting stacked structure and an extension portion extending from the second electrode pad toward the first side, wherein the first electrode structure and the second electrode structure include reflectors that are arranged under the extension portions of the first electrode structure and the second electrode structure.

21. The LED of claim 20, wherein the extension portion of the first electrode structure and the second electrode structure include two areas that extend toward the third and fourth sides, respectively.

22. The LED of claim 20, wherein a distance between the extension portions of the first electrode structure and the second electrode structure is maintained at a constant level throughout at least a part of the extension portions.

23. The LED of claim 20, wherein the extension portions of the first electrode structure and the second electrode structure are directly connected to the first region or the second region at an end of the extension portions.

24. The LED of claim 20, wherein the first region includes an n-type semiconductor layer and the second region includes a p-type semiconductor layer.

* * * * *